United States Patent [19]
Mote, Jr.

[11] Patent Number: 5,805,609
[45] Date of Patent: Sep. 8, 1998

[54] METHOD AND APPARATUS FOR TESTING A MEGACELL IN AN ASIC USING JTAG

[75] Inventor: L. Randall Mote, Jr., Laguna Hills, Calif.

[73] Assignee: Samsung Electronics Co., Ltd., Seoul, Rep. of Korea

[21] Appl. No.: 883,803

[22] Filed: Jun. 27, 1997

Related U.S. Application Data

[63] Continuation of Ser. No. 528,397, Sep. 14, 1995, which is a continuation-in-part of Ser. No. 480,483, Jun. 7, 1995, abandoned.

[51] Int. Cl.$^6$ .................................................. G01R 31/28
[52] U.S. Cl. .................................. 371/22.31; 395/183.06
[58] Field of Search ........................... 371/22.31, 22.32, 371/22.34, 22.5, 25.1, 27.5; 395/182.05, 183.01, 183.06, 183.03, 183.15, 183.19; 364/489, 550; 324/765, 76.11; 365/201

[56] References Cited

U.S. PATENT DOCUMENTS

| | | | |
|---|---|---|---|
| 4,855,669 | 8/1989 | Mahoney | 324/73 R |
| 4,947,395 | 8/1990 | Bullinger et al. | 371/22.3 |
| 5,115,435 | 5/1992 | Langford et al. | 371/22.3 |
| 5,150,044 | 9/1992 | Hashizume et al. | 324/158 R |
| 5,418,470 | 5/1995 | Dagostino et al. | 324/763 |
| 5,426,626 | 6/1995 | Frisch et al. | 371/22.1 |
| 5,442,640 | 8/1995 | Bardell, Jr. et al. | 371/21.1 |
| 5,448,575 | 9/1995 | Hashizume | 371/22.3 |
| 5,448,576 | 9/1995 | Russell | 371/22.3 |
| 5,596,585 | 1/1997 | Njinda et al. | 371/22.5 |
| 5,610,927 | 3/1997 | Segars | 371/22.3 |
| 5,617,431 | 4/1997 | Tupuri et al. | 371/27 |
| 5,644,580 | 7/1997 | Champlin | 371/22.5 |

OTHER PUBLICATIONS

IEEE Std 1149.1–1990 (Includes IEEE Std 1149.1a–1193), IEEE Computer Society, "IEEE Standard Test Access Port and Boundary–Scan Architecture",Published by the Institute of Electrical and Electronics Engineers, Inc. Oct. 21, 1993.

*Primary Examiner*—Robert W. Beausoliel, Jr.
*Assistant Examiner*—Nadeem Iqbal
*Attorney, Agent, or Firm*—Knobbe, Martens, Olson & Bear, LLP

[57] ABSTRACT

Specially modified JTAG test circuitry is used to provide test inputs and outputs for vendor supplied megacells with buried I/Os within an integrated circuit chip. A multiplexer or similar circuit is used to alternatively select between a JTAG boundary scan output or a megacell circuit test output in response to JTAG instructions within an instruction register. Additionally, a multiplexer or similar circuit is used to alternatively select between an input pin or normal circuitry for input to a megacell's buried input. Furthermore, an AND or OR gate is used to allow test inputs to a megacell, which are normally tied either high or low, to be controlled by an input pin when in the special JTAG test mode. In this manner, test vectors applied at test inputs to the megacell circuitry result in test outputs to the megacell circuitry being provided on output pins of the integrated circuit without requiring additional input and/or output pins that are solely operational as test inputs or outputs to the megacell circuitry.

5 Claims, 4 Drawing Sheets

METHOD AND APPARATUS FOR TESTING A MEGACELL IN AN ASIC USING JTAG

RELATED APPLICATIONS

This application is a continuation of U.S. patent application Ser. No. 08/528,397, filed Sep. 14, 1995, which was a continuation-in-part of U.S. patent application Ser. No. 08/480,483, filed Jun. 7, 1995 now abandoned.

BACKGROUND OF THE INVENTION

1. Field of the Invention

The present invention relates to improvements in testing of integrated circuits. Specifically, the invention involves a method and apparatus for testing a megacell within an application specific integrated circuit "ASIC" at the chip level.

2. Description of Related Art

The increasing complexity of circuit designs and new integrated circuit packaging techniques leads to an ever increasing problem of testing integrated circuits and printed circuit boards. Software testing of digital hardware is constantly improving, however the complexity of the circuitry makes testing more difficult unless the components are designed with testability in mind.

One method for testing circuitry which has received notable attention is the IEEE 1149.1 Boundary-Scanned Standard originated by the International Joint Tests Action Group (JTAG), (hereby incorporated by reference). One implementation of this standard involves designing components (e.g., integrated circuits) for serial boundary-scanned testing by providing shift-register elements daisy chained to form a path around the periphery of an integrated circuit component. The idea behind the serial testing is to shift serial data into and through a number of integrated circuit components. The serial data is applied to inputs of known circuitry to effect outputs as determined by the circuit functions. A master testing circuit compares the return data to an expected result (i.e., a result which is dependent upon the functions of the known circuitry). In other words, the serial data inputs applied to the circuit being tested produces known outputs if the circuit is functioning properly. If the data stream returned to the master testing circuit is not as expected, then a malfunction in the circuit is detected by the testing circuit. A careful analysis (under software control) of the deviations in the data stream may isolate any malfunctions within a circuit.

Boundary-scanned testing of components, as briefly explained above, can also be expanded to testing of a very large scale integrated (VLSI) circuitry such as an ASIC. An ASIC includes internal logic circuitry which is normally inaccessible via the output pins supplied on the IC package. Such internal logic circuitry within the ASIC is typically vendor-supplied as a module having defined inputs and outputs, and is commonly referred to as a megacell. In some circuit boards, the test inputs and outputs for the vendor-supplied megacell within the ASIC are connected to special pins on the IC package so that the megacell is accessible for testing purposes by the manufacturer via external pins on the IC package. However, the extra pins required to test the cell are typically of no use during normal implementation and operation of the IC. Furthermore, the additional test pins sometimes require the manufacturer to increase the IC package to the next larger size die and or package because of the increased number of pins. Thus, the IC package takes additional printed circuit board real estate and costs are increased because a larger die size is generally more expensive.

Furthermore, the standard JTAG specification allows a megacell within an ASIC to be surrounded internally with JTAG cells. However, use of this test architecture is incompatible with the way a vendor typically tests megacells supplied by the vendor. That is, megacell vendors generally have a standard test for their megacells. While the standard test vectors and testing methods provided by the vendor to test a megacell are flexible enough to allow for alternate pin ordering when testing their megacells, it is cost prohibitive for a vendor to change the functionality of the standard test. For example, a standard vendor test might be serially loaded through the JTAG port and applied in parallel to the megacell but this would be cost prohibitive since it would multiply the test time by twice the length of the JTAG chain.

SUMMARY OF THE INVENTION

A JTAG interface is used, in accordance with one aspect of the present invention to load a custom JTAG instruction which will bring the test inputs and outputs for a vendor-supplied megacell within an ASIC to the output pins in place of the normal signals provided on the output pins for use by the fabricator of the ASIC in his chip level testing of that ASIC. Thus, extra pins are not required to test the cell. This saves pins and prevents the manufacturer from having to go to the next larger die size and or package size because of additional test pins. Thus, printed circuit board real estate is reduced, and costs are reduced because the smaller die size is generally less expensive. The JTAG interface is not used in the manner it was intended (i.e., as the sole interface to the tester). Instead, it is used to place the ASIC in a test mode which allows a vendor's standard megacell test to run, without adding new pins.

Under one aspect, the present invention is a system which provides for a reduced number of external pins on an integrated circuit (IC) package having JTAG test capability. The system comprises custom designed digital logic circuitry formed within the IC package. The custom designed digital logic circuitry has inputs and outputs. The system further comprises a standardized megacell module having independent functionality formed within the IC package and incorporated into the IC package so as to communicate and function in unison with the custom designed digital logic circuitry. The megacell module has test inputs and test outputs which are used to test functionality of the megacell module. The system also includes a JTAG boundary scan data test register having outputs which stores a test vector used to test integrity of inputs and outputs of the IC package. In addition, the system comprises first selection circuitry having first inputs connected to at least one of the outputs of the data test register and at least one of the test outputs of the megacell module, where the first selection circuitry further receives a first selection input and provides one of the first inputs as an output based upon the first selection input; and second selection circuitry having second inputs connected to the output of the first selection circuitry and to at least one of the outputs of the custom designed digital logic circuitry, where the second selection circuitry further receives a second selection input and provides one of the second inputs as an output based upon the second selection input. The system of the invention additionally comprises a JTAG instruction register which stores instruction bits, and wherein the instruction bits are used to determine the first selection input to the first selection circuitry and the second selection input to the second selection circuitry. Finally, the system includes a plurality of external pins connected as outputs of the second selection circuitry so that the test outputs of the megacell module are provided on the external pins when the instruction register is set to cause the first and second selection circuitry to propagate the megacell module test inputs and outputs to the external pins.

Under a further aspect, the invention is a method of testing a megacell within an integrated circuit having the megacell as an integral component of circuitry within the integrated circuit. The megacell has at least one test output signal having no connection external to the integrated circuit during operation of the integrated circuit. The integrated circuit has a plurality of signals which are provided as outputs on respective pins of the integrated circuit during the operation of the integrated circuit. The method comprises applying a serial instruction to the integrated circuit via a JTAG input pin to place the integrated circuit into a predetermined test mode; selectively disabling one of the plurality of output signals from a respective first pin of the integrated circuit; selectively routing the test output from the megacell to the respective first pin of the disabled output signal; applying a test input to the megacell via a second pin of the integrated circuit to stimulate the megacell to perform a test operation; and monitoring the test output of the megacell at the respective first pin of the integrated circuit.

DETAILED DESCRIPTION OF THE INVENTION

Figure 1:
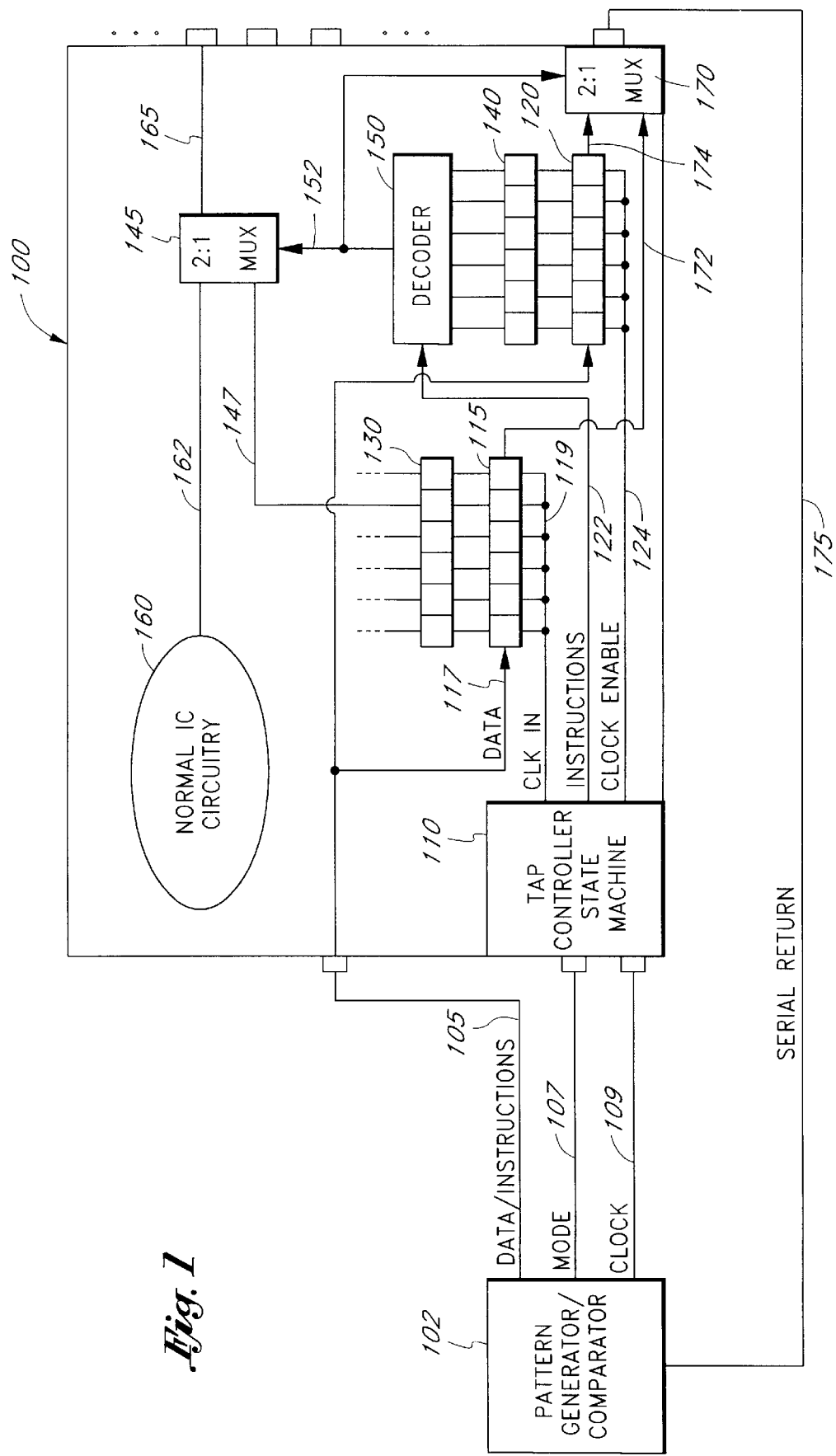
FIG. 1 is a schematic block diagram which illustrates the configuration of a JTAG test circuit.

FIG. 1 is a schematic block diagram showing an integrated circuit (IC) chip 100 configured for testing using a JTAG IEEE 1149.1 daisy-chain boundary-scan serial testing system. The exemplary JTAG system shown in FIG. 1 comprises a master pattern generator/comparator 102 which outputs a data/instruction signal over a line 105, a mode signal over a line 107, and a clock signal over a line 109. It should be understood that according to conventional terminology, the data/instruction signal line 105 is also referred to as the TDI signal line, the mode signal line 107 is referred to as the TMS signal line, and the clock signal line 109 is referred to as the TCK signal line. The output lines 105, 107, and 109 of the pattern generator/comparator 102 connect to external input pins extending from the IC 100 so that a TAP controller state machine 110 within the IC 100 receives the signals via the lines 105, 107, and 109.

The TAP controller state machine 110 connects to a data shift register 115 via a serial data line 117 and a clock enable line 119. The TAP controller state machine 110 further connects to an instruction shift register 120 via a serial instructions line 122 and a clock enable line 124. It should be noted here that, typically, the TDI line 105, the serial data line 117, and the serial instructions line 122 are connected to a common node and the lines 105, 117, and 122 differ only insofar as they are considered as carrying data, instructions, or both.

The data shift register 115 is connected in parallel with a latched data register 130, while the instruction shift register 120 connects in parallel with a latched instruction register 140. Each of the bit storage locations within the latched data register 130 connects to a first input of a multiplexer within the IC 100. For example, as depicted in FIG. 1, one of the storage locations of the latched data register 130 connects to a first input of a 2:1 multiplexer 145 via a line 147. Similarly, each of the storage locations within the latched data register 130 connects to an input of a multiplexer within the IC 100; however, for simplicity of illustration, only one multiplexer 145 is depicted in FIG. 1 as connected to the latched data register 130.

The latched instruction register 140 connects in parallel to a decoder 150 which is used to decode the instructions stored within the latched instruction register 140. The decoder 150 provides select output to each of the JTAG multiplexers within the IC 100 (i.e., the multiplexers used to provide JTAG forced output levels). However, again for simplicity of illustration, the decoder 150 is shown in FIG. 1 to provide only a single select output to the multiplexer 145 via a line 152.

A second input of the multiplexer 145 connects to the normal integrated circuitry 160 within the IC 100 via a line 162. The normal integrated circuitry 160 within the IC 100 is the circuitry which performs the specified functions which the IC 100 carries out during normal operation (i.e., when the IC 100 is not being tested). The output of a multiplexer 145 connects to an output pin on the surface of the IC 100 via a line 165.

The data shift register 115 and the instruction shift register 120 respectively output serial data and instruction lines 172, 174 as first and second inputs to a 2:1 multiplexer 170 which, in turn, outputs a serial data return line 175 to the pattern generator/comparator 102.

In operation, the pattern generator/comparator 102 generates a pattern of data and/or instructions (typically called a test vector) which are serially transmitted over the line 105 to the TAP controller state machine 110. The pattern generator/comparator 102 further provides a mode and a clock signal to the TAP controller state machine 110 via the lines 107, 109, respectively. As will be described in greater detail below with reference to FIG. 3, the TAP controller state machine 110 responds to the mode and clock signals to shift the data or instructions provided on the line 105 into either the data shift register 115 (i.e., when data are provided along the line 105) or into the instruction shift register 120 (i.e., when instructions are provided over the line 105). The data which is shifted into the data shift register 115 and the instructions which are shifted into the instruction shift register 120 are serially clocked into their respective shift registers 115, 120 under the control of the TAP controller state machine 110. Thus, for example, if 70 data bits are to be shifted into the data shift register 115 and 30 instruction bits are to be shifted into the instruction shift register 120, a total of 100 clock cycles will be taken to shift each of the data and instruction bits into their respective shift registers. Of course, as will be described in greater detail below, additional clock cycles will be necessary to transfer data from the pattern generator/comparator 102 to the TAP controller state machine 110 and to change the mode of the TAP controller state machine 110 so that the TAP controller state machine 110 provides the appropriate control signals on the clock enable lines 119, 124.

Once the appropriate data for testing the designated inputs and outputs of the IC 100 are shifted into the shift registers 115, 120, the shift registers 115 and 120 parallel latch the data and instructions contained within the shift registers 115, 120 into the respective latched registers 130, 140. The instructions latched into the register 140 are decoded by the decoder 150 to select the appropriate output of the multiplexer 145, as well as any other JTAG multiplexers (not shown) within the IC 100. As briefly described above, each of the JTAG multiplexers (e.g., the multiplexer 145 shown in FIG. 1) receives a JTAG input which is connected to the latched data register 130. Thus, for example, the multiplexer 145 is enabled by the decoder 150 via the line 152 to select the input 147 connecting to a storage location within the register 130. Thus, the output 165 of the multiplexer 145 is forced to the bit value stored within the register 130. In this manner, the output connections of the IC 100 over the line 165 may be tested for defects. For example, if the storage location connected to the multiplexer 145 via the line 147 contains a high voltage level bit (i.e., corresponding to a digital 1), then the output of the multiplexer 145 along the line 165 should be detected at the output pin of the IC 100 to be a digital 1. If this output pin does not generate a digital 1, then the test circuitry to which the IC 100 is connected will register an error so that the IC 100 may be designated as defective. This test is performed for each of the inputs and outputs designated by the decoder 150 in response to the instructions loaded by the pattern generator/comparator 102.

Of course, although not depicted in FIG. 1, it will be understood that multiple ICs may be connected in series in a daisy-chain configuration so that the pattern generator/comparator 102 can shift in data and instructions for multiple ICs at one time. Thus, the IC 100 includes a multiplexer 170 which selectively shifts out the data passing through the register 115 or the instructions passing through the register 120 via the lines 172 or 174 under the control of the TAP controller state machine 110. Finally, the data output from the last IC is transferred back to the pattern generator/comparator 102 via the serial return line 175.

Figure 2:
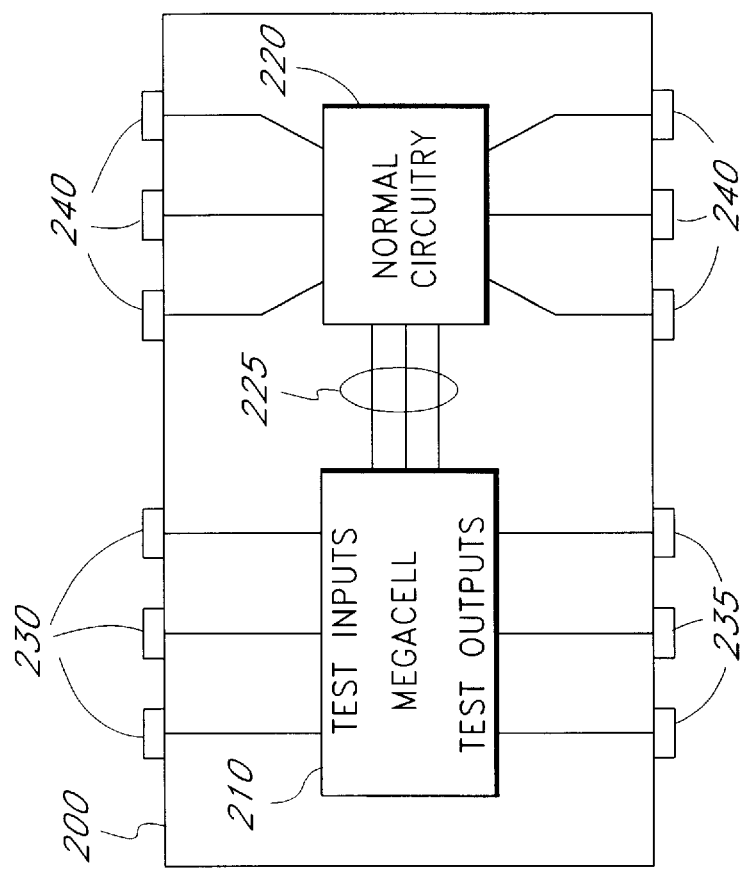
FIG. 2 is a schematic block diagram which shows an IC circuit having a megacell with test input/output terminals connected to external pins of the IC.

FIG. 2 is a schematic block diagram which depicts an IC 200 including a vendor-supplied megacell 210 in addition to normal integrated circuitry 220. The megacell 210 operates as a functional unit within the IC 200 which receives inputs from and provides inputs to the normal circuitry 220 via lines 225.

The vendor-supplied megacell 210 is distinguished from the normal circuitry 220 in that the vendor-supplied megacell 210 has a standardized structure and function provided by the vendor, while the normal circuitry is custom designed by an ASIC designer. Thus, the megacell module has an independent functionality (i.e., the megacell could be used to perform the same function in a variety of different surrounding circuit configurations so that this functionality is substantially independent from the other circuitry within the IC 200). Furthermore, a separate set of test vectors than those used to test the overall IC 200 are typically used to separately test the functionality of the megacell 210.

Thus, for example, an ASIC designer uses standard functional logic blocks such as UARTS, phase locked loops, etc., as a part of the ASIC design. An ASIC vendor supplies structure for these standard functional logic blocks, which the ASIC designer incorporates into a custom ASIC. These standard functional blocks are referred to as megacells, and the megacell vendor typically supplies test vectors which are used by the chip foundry during the manufacturing process to test the megacell within the ASIC. Typically, the ASIC can be tested as an entire unit, but if malfunctions are discovered in the entire unit, it will be difficult to determine if the malfunctions are due to custom circuitry whose structure is provided by the ASIC designer or due to the cell vendor-supplied megacell circuitry. For this reason, the megacells are tested independently using the test vectors provided by the cell vendor. Additionally, the ASIC designer need not expend the effort to exhaustively test the megacell since this testing will be done via the vendor supplied tests.

However, as depicted in FIG. 2, in order to test a megacell such as the megacell 210, test outputs from the megacell 210 require multiple output pins 235 on the exterior surface of the ASIC 200. The vendor-supplied test vectors are applied to the test inputs 230, and the resulting pattern on the test outputs 235 is measured to determine if the megacell is functioning correctly. The testing of the megacell functionality is typically performed at the chip foundry (i.e., as a test after fabrication), but is not necessary after the chip is in normal operational use. Thus, for example, only the operational inputs and outputs 240 would be used when the IC 200 is implemented within a circuit during normal operation. Thus, the output pins 235 are superfluous during normal operation of the IC 200. As will be described in greater detail with reference to FIG. 4 below, the present invention provides for a reduction of the number of output pins on an IC package which incorporates a megacell circuit. The savings afforded by the present invention could be significant (e.g., on the order of one or two dozen pins could be eliminated) so that a more cost effective (i.e., smaller) die size and IC package could be used.

Figure 3:
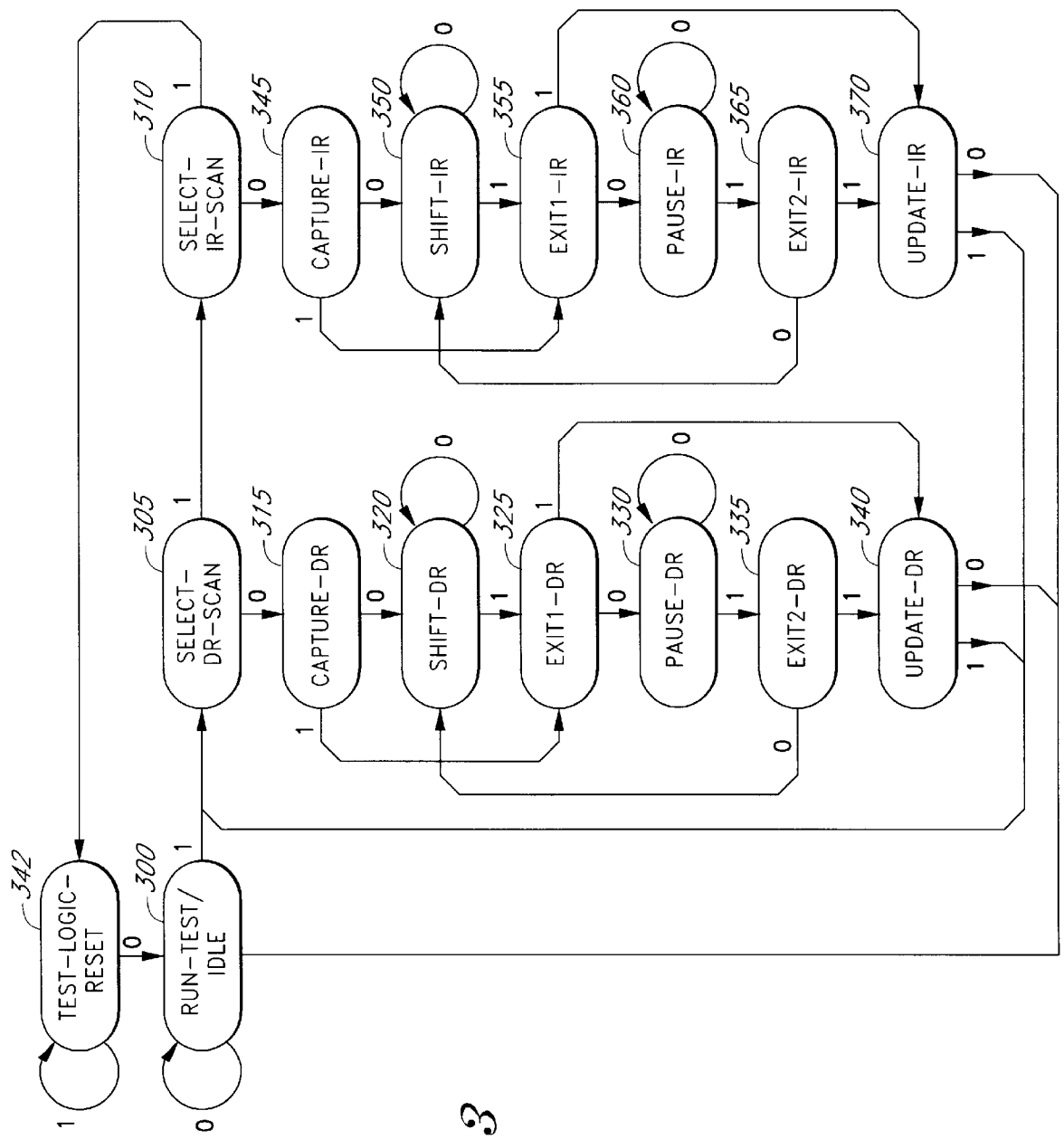
FIG. 3 is a state diagram showing the operation of the TAP controller circuit used to control the JTAG test circuit.

FIG. 3 is a state diagram which illustrates the operation of the TAP controller 110 in response to control signals provided on the mode and clock lines 107, 109. The TAP controller state machine 110 begins in an idle state 300 which constitutes a controller state between scan operations. Once entered, the TAP controller 110 will remain in the idle state 300 as long as the TMS is held low. In the idle state 300, activity in selected test logic occurs only when certain instructions are present as is well understood in the art. For instructions loaded in the instruction register 140 that do not cause functions to execute in the idle TAP controller state 300, all test data registers selected by the current instruction shall retain their previous state (i.e., idle). Furthermore, the instructions loaded within the instruction register 140 do not change while the TAP controller 110 is in the idle state 300.

When the TMS (mode signal along the line 107) is high and a rising edge is applied to the TCK signal (clock over the line 109) the TAP controller 110 moves to a select data register scan state 305. The select data register scan state 305 is a temporary controller state in which all test data registers selected by the current instruction retain their previous state. If TMS is held low while a rising edge is applied to TCK, then the TAP controller 110 transitions to a capture data register state 315, while if TMS is held high, and a rising edge is applied to TCK, then the TAP controller state machine 110 transitions to a select instruction register scan state 310.

If the TAP controller state machine 110 transitions into the capture data register state 315, then, in this state, data may be parallel-loaded into the data register 130 from the shift data register 115 on the rising edge of TCK. If the JTAG test circuitry does not include a parallel-loaded data register 130, or if capturing is not required for the selected test, then the data register retains its previous state unchanged. Furthermore, the bits stored within the instruction registers 140, 120 remain unchanged while the TAP controller state machine 110 is in the captured data register state 315. When the TAP controller 110 is in the capture data register state 315 while TMS is held low and a rising edge is applied to TCK, then the controller enters a shift data register state 320. However, if TMS is held high while the rising edge is applied to TCK, then the TAP controller state machine 110 transitions to an exit data register state 325 directly from the capture data register state 315. Within the shift data register state 320, data along the line 105 is shifted into the data shift register 115 via the line 117. Upon the application of each rising edge of TCK while TMS is held low, an additional bit of data is shifted into the data shift register 115 over the line 117. The TAP controller 110 continues in the shift data register state 320 as long as TMS is held low. Thus, as many data bits as are necessary to load the prespecified test vectors into the shift registers 115 are shifted into the register 115 while TMS is held low in the state 320.

When the TAP controller 110 is in the shift data register state 320 and a rising edge is applied to TCK while TMS is held high, then the TAp controller state machine 110 enters the exit data register state 325. The exit data register state 325 is a temporary controller state. If TMS is held high, a rising edge applied to TCK causes the TAP controller 110 to enter an update data register state 340, while if TMS is held low while the rising edge is applied to TCK then the TAP controller 110 enters a pause data register state 330. The pause data register state 330 allows the shifting of the test data register 315 to be temporarily halted. The TAP controller 110 remains in pause data register state 330 while TMS is held low. When TMS is held high and a rising edge is applied to TCK, then the TAP controller state machine 110 enters an exit 2 data register state 335 which is also a temporary controller state. If a rising edge is applied to TCK while TMS is held low, then the TAP controller state machine 110 returns to the shift data register state 320. However, if TMS is held high while a rising edge is applied to TCK, then the TAP controller state machine 110 transitions from the exit 2 data register state 335 to the update data register state 340. As shown in FIG. 1, the shift data register 115 includes a latched parallel output to prevent changes to the data in the data register 130 while data is shifted in the associated shift register path 115 in response to certain instructions with the instruction register 140. Thus, in the update data register state 340, data is latched from the shift register 115 onto the parallel output of the shift register 115 on the falling edge of TCK. Thus, this data is stored within the latched data register 130 so that the data within the register 130 does not change other than in the update data register state unless operation during the execution of a self-test is required (e.g., during the idle state in response to a design-specific public instruction). As with each of the states 305–335, the instructions stored within the instruction shift register 120 and the instruction latch data register 140 do not change while the TAP controller 110 is within the update data register state 340. When the TAP controller is in the update data register state and a rising edge is applied to TCK, the TAP controller 110 enters the select data register scan state 305 when TMS is held high, or the idle state 300 when TMS is held low.

If TMS is held high, and a rising edge is applied to TCK while the TAP controller state machine 110 is in the select data register state 305, then the TAP controller state machine 110 transitions to the select instruction register scan state 310.

If the TAP controller state machine 110 transitions into the capture instruction register state 345, then, in this state, instructions may be parallel-loaded into the instruction register 140 from the shift instruction register 120 on the rising edge of TCK. If the JTAG test circuitry does not include a parallel-loaded instruction register 140, or if capturing is not required for the selected test, then the instruction shift register 120 retains its previous state unchanged. Furthermore, the bits stored within the data registers 130, 115 remain unchanged while the TAP controller state machine 110 is in the captured instruction register state 345. When the TAP controller 110 is in the capture instruction register state 345 while TMS is held low and a rising edge is applied to TCK, then the controller enters a shift instruction register state 350. However, if TMS is held high while the rising edge is applied to TCK, then the TAP controller state machine 110 transitions to an exit instruction register state 355 directly from the capture instruction register state 345. Within the shift instruction register state 350, instructions along the line 105 are shifted into the instruction shift register 120 via the line 122. Upon the application of each rising edge of TCK while TMS is held low, an additional bit of instruction is shifted into the instruction shift register 120 over the line 122. The TAP controller 110 continues in the shift instruction register state 350 as long as TMS is held low. Thus, as many instruction bits as are necessary to load the prespecified instruction vectors into the shift registers 120 are shifted into the register 120 while TMS is held low in the state 350.

When the TAP controller 110 is in the shift instruction register state 350 and a rising edge is applied to TCK while TMS is held high, then the TAP controller state machine 110 enters the exit instruction register state 355. The exit instruction register state 355 is a temporary controller state. If TMS is held high, a rising edge applied to TCK causes the TAP controller 110 to enter an update instruction register state 370, while if TMS is held low while the rising edge is applied to TCK then the TAP controller 110 enters a pause instruction register state 360.

The pause instruction register state 360 allows the shifting of the test instruction register 345 to be temporarily halted. The TAP controller 110 remains in pause instruction register state 360 while TMS is held low. When TMS is held high and a rising edge is applied to TCK, then the TAP controller state machine 110 enters an exit-2 instruction register state 365 which is also a temporary controller state. If a rising edge is applied to TCK while TMS is held low, then the TAP controller state machine 110 returns to the shift instruction register state 350. However, if TMS is held high while a rising edge is applied to TCK, then the TAP controller state machine 110 transitions from the exit-2 instruction register state 365 to the update instruction register state 370. As shown in FIG. 1, the shift instruction register 120 includes a latched parallel output to prevent changes to the instruction in the instruction register 140 while instruction is shifted in the associated shift register path 120 in response to certain instructions with the instruction register 140. Thus, in the update instruction register state 370, instructions are latched from the shift register 120 onto the parallel output of the shift register 120 on the falling edge of TCK. Thus, these instructions are stored within the latched instruction register 140 so that the instructions within the register 140 do not change other than in the update instruction register state unless operation during the execution of a self-test is required (e.g., during the idle state in response to a design-specific public instruction). As with each of the states 310 and 345–365, the data stored within the data shift register 115 and the latched data register 130 do not change while the TAP controller 110 is within the update instruction register state 370. When the TAP controller 110 is in the update instruction register state 370 and a rising edge is applied to TCK, the TAP controller 110 enters the select data register scan state 305 when TMS is held high, or the idle state 300 when TMS is held low.

If within the select instruction register state 310 TMS is held high while a rising edge is applied to TCK, the TAP controller 110 enters the test logic reset state 342. When the TAP controller state machine 110 enters the test logic reset state 342, the test logic is disabled so that normal operation of the on-chip system logic (i.e., in response to signals received through the system pins) can continue unhindered. The TAP controller 110 remains in the test logic reset state 342 while TMS is held high. By holding TMS low during a rising edge on TCK, the TAP controller state machine 110 will enter the idle state 300.

Figure 4:
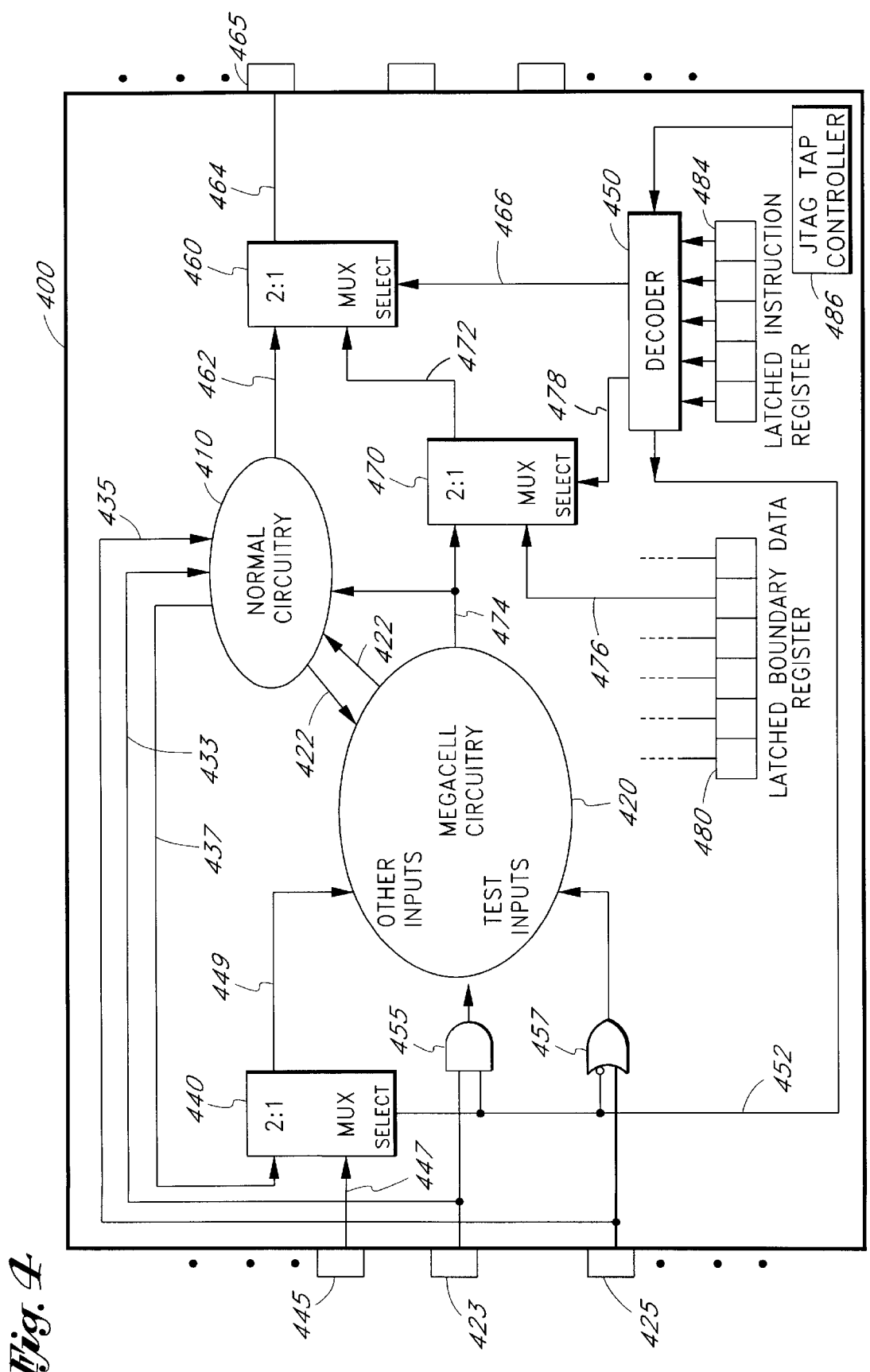
FIG. 4 is a schematic block diagram showing an improved JTAG test circuit which provides a connection of an internal megacell with an external pin.

FIG. 4 is a schematic block diagram which shows an exemplary internal JTAG test circuit within an IC 400. For simplicity of illustration of the present invention, the TAP state controller 110, the data and instruction shift registers 115, 120, and other associated JTAG circuitry are not shown in FIG. 4. However, it will be understood by those of ordinary skill in the art that the IC 400 includes the aforementioned JTAG circuitry having substantially the same operation as described above. The IC 400 may, for example, comprise an application-specific integrated circuit (ASIC) which includes custom-digital circuitry designed by an ASIC designer (represented in FIG. 4 as normal circuitry 410) and a vendor-supplied structure for a megacell which the ASIC designer incorporates into the custom ASIC (represented as the megacell circuitry 420 in FIG. 4). The normal circuitry 410 communicates via input and output lines 422 with the megacell circuitry 420. For example, the megacell circuitry 420 may comprise a standard arithmetic logic unit, microprocessor, or other circuitry which has a standard design and can be implemented as an independent module within the ASIC 400.

The normal circuitry 410 receives inputs from external pins such as pins 423, 425, via lines 433, 435. Of course, it will be understood that typically the normal circuitry 410 will receive on the order of dozens, or even hundreds of inputs but for purposes of clarity in illustrating the present invention, only the input terminals 423, 425 are shown to connect to the normal circuitry 410. In addition to outputting signals to the megacell circuitry 420 via the lines 422, the normal circuitry 410 may also output certain signals to the megacell circuitry 420 via a line 437 which connects to a first input of a 2-to-1 multiplexer 440. The multiplexer 440 further receives an input signal from an external pin 445 via a second input 447. The output of the multiplexer 440 is provided to an input of the megacell 420 via a line 449 as shown in FIG. 4.

The multiplexer 440 receives a select input from a decoder 450 via a line 452. The megacell circuitry 420 further receives test inputs from an AND-gate 455 and an OR-gate 457. Of course, it should be understood, that the megacell circuitry 420 will typically include several test inputs, but the AND-gate 455 and the OR-gate 457 are shown to provide two exemplary test inputs to the megacell circuitry 420. The AND-gate 455 receives a first input via the line 452 and a second input via the line 433 from the input pin 423. Furthermore, the OR-gate 457 receives a first inverting input via the line 452 and a second input via the line 435 from the input pin 425. Although not shown in FIG. 4, pin input and output buffers are assumed to be present but are not shown for ease of illustration.

The normal circuitry 410 connects to an input of a JTAG output multiplexer 460 via a line 462. Again, it should be understood, that the normal circuitry 410 will typically include on the order of tens or hundreds of outputs, however, for clarity of illustration, only the output 462 is depicted in FIG. 4. The output of a 2-to-1 multiplexer 460 is provided to an external pin via a line 464. A select input of the 2-to-1 multiplexer 460 is provided by decoder 450 via a line 466.

According to conventional circuitry, the second input of the 2-to-1 multiplexer 460 would connect directly to a latch boundary scan data register so that the JTAG standard input value would force the output terminal 465 to be equal to the JTAG bit when the appropriate select signal was provided to the input of the 2-to-1 multiplexer 460. However, in accordance with the present invention, the second input of the multiplexer 460 may also receive an output from the megacell circuitry 420 via a 2-to-1 multiplexer 470 over a line 472.

Specifically, the 2-to-1 multiplexer 470 receives a first input via a line 474 from the megacell circuitry 420. The 2-to-1 multiplexer 470 further receives a second input from a latch boundary scan data register 480 via a line 476. Finally, the 2-to-1 multiplexer 470 receives a select input from the decoder 450 via a line 478. The decoder 450 decodes instructions contained within a latched instruction register 484.

During normal (i.e., non-test) operation, the normal circuitry 410 and the megacell circuitry 420 receive inputs via a plurality of input pins (e.g., the input pins 423, 425 and 445) and process these inputs in accordance with the ASIC design to provide the appropriate output values on a plurality of output pins (e.g., the output pin 465). During normal operation, the normal circuitry 410 and the megacell circuitry 420 exchange information via internal circuit paths (e.g., the circuit paths 422, 437, 449 and 474) so that the megacell circuitry 420 acts as a module which performs a prespecified function that supports the overall operation of the ASIC 400.

Thus, in order to test the functionality of megacell circuits within ASICs, it is typically necessary to pull certain input and output lines of the megacell to external pins on the ASIC so that the chip foundry can test the megacell circuitry independently using test vectors supplied by the megacell vendor. Of course, as detailed above, this results in a number of extraneous pins on the surface of the IC which are not used during normal operation of the IC. Thus, in accordance with the present invention, the JTAG circuitry found in the ASIC 400 is specially modified to provide an output path for the megacell circuitry 420 so that the megacell circuitry 420 may be tested by the chip foundry without requiring additional output pins to be provided on the ASIC 400.

Specifically, the additional multiplexer 470 allows the second input to the multiplexer 460 to be used alternately as a JTAG output or as a megacell output as determined by the signal on the select line 478 from decoder 450. Thus, rather than connecting the test output line 474 of the megacell 420 directly to an external pin, the same output line 464 which is used to alternately output the JTAG standard boundary scan output or the normal circuitry output value may also be used to output the test signal from the megacell circuitry 420. The selection of the output signal on the line 464 from one of the three possible outputs (i.e., the output from a normal circuitry 410, the output from the megacell circuitry 420, or the JTAG boundary scan output from the latch data register 480) is coordinated under the control of the decoder 450 as determined by the instructions contained within the latched instruction register 484. Thus, implementation of the present invention may require additional storage locations or decode patterns within the latched instruction register 484, to provide for the additional control signals. However, present instruction registers within JTAG test circuitry typically are user defined so that spare decode states can be used to provide for additional control information.

When testing the megacell circuitry 420 in accordance with the methods of the present invention, test vector inputs (supplied by the megacell vendor) are applied to selected external input pins (e.g., the pins 423, 425). When the signal on the line 452 is held high, then the test vector inputs supplied to the terminals 423, 425, are passed through the AND-gate 455 and the OR-gate 457 to the test inputs of the megacell circuitry 420. It will be appreciated by those of skill in the art that when not in test mode the signal on the line 452 will be low, the outputs of the AND-gate 455 and the OR-gate 457 are set to low and high, respectively, so as to prevent the test inputs to the megacell circuitry 420 from changing during normal operation. When the standard test vector inputs applied at the input terminals 423, 425 are propagated through to the test inputs of the megacell circuitry 420, the megacell circuitry 420 outputs signals in response to the test vector inputs over multiple output lines. In the example of FIG. 4, only the output line 474 is shown for ease of illustration; however, it will be understood that a plurality of output lines will be provided to a plurality of 2-to-1 multiplexers (such as the multiplexer 470) in order to fully test the functional characteristics of the megacell circuitry 420.

The signal output by the megacell circuitry 420 in response to the test vector inputs is provided as the first input to the multiplexer 470 over the line 474. The latched instruction register 484, when in the megacell test mode, further contains instruction bits which cause the decoder 450 to assert the select signal on the line 478 to select the megacell test output on the line 474. Thus, the output of the megacell circuitry 420 in response to the test vector inputs is provided on the line 472 at the output of the multiplexer 470. The decoder 450 further provides a signal on the line 464, in response to the instructions within the register 484, to select the input line 472 so that the megacell circuitry test output is provided on the line 464 to the output pin 465. If the megacell circuitry 420 is functioning correctly, then the test vector inputs will cause the appropriate pattern of test vector outputs to appear on the output pins for which a path is provided from the megacell circuitry 420. Thus, the output pin 465 will be indicative of the functionality of the megacell circuitry 420 when the test vector inputs are applied to the input pins 423, 425. In this manner, the functionality of the megacell circuitry 420 may be tested without the provision of additional output pins on the ASIC 400.

When the functionality of the megacell circuitry 420 is not being tested, the instruction register 484 is loaded with the appropriate instruction bits to cause the decoder 450 to select either the normal operation mode or the JTAG test mode. When the JTAG test mode is selected, this causes the decoder 450 to output a select signal over the lines 478 to propagate the input over the line 476 from the latch data register 480 to the output 472 of the multiplexer 470. Furthermore, the decoder 450 outputs a select signal over the line 466 which causes the input on the line 472 (which represents the value of a data bit within the latch data register 480 via the line 476) to be propagated on the output 464 of the multiplexer 460 so that the JTAG boundary scan data bit is provided on the output pin 465 if the output path has integrity.

If, on the other hand, the ASIC 400 is to operate in the normal manner, the JTAG TAP state controller 486 causes the decoder 450 to select the first input 462 of the multiplexer 460 so that the signal on the line 462 is output to the pin 465 via the multiplexer 460 and the line 464. Further, the decoder 450 outputs a low signal on the line 452 so that the test inputs to the megacell circuitry 420 are held to defined values so that the operation of the megacell circuitry 420 is not affected by the inputs on the pins 423, 425.

Although the preferred embodiments of the present invention have been described in detail above, it will be understood to those of ordinary skill in the art that obvious modifications could be made to the invention without departing from its spirit or essential characteristics. Thus, the foregoing description should be considered as illustrative and not restrictive. The scope of the present invention should therefore be defined in view of the appended claims.

What is claimed is:

1. A system which permits an embedded megacell within an integrated circuit to be tested using test vectors applied to input/output pins of the integrated circuit without requiring dedicated input/output pins for the test vectors, said system comprising:

custom designed digital logic circuitry formed within said integrated circuit, said custom designed digital logic circuitry having inputs and outputs which are connected to input/output pins of said integrated circuit when said integrated circuit is operating in a normal operational mode;

a standardized megacell module having independent functionality formed within said integrated circuit and incorporated into said integrated circuit so as to communicate and function in unison with said custom designed digital logic circuitry, said megacell module having test inputs and test outputs which are used to test functionality of said megacell module, said test inputs and test outputs having no connections to input/output pins of said integrated circuit when said integrated circuit is operating in said normal operational mode;

a JTAG boundary scan data register which stores a test vector used to test integrity of inputs and outputs of said integrated circuit, said boundary scan data register having outputs;

selection circuitry having first inputs which receive said outputs from said custom designed logic circuitry, second inputs which receive said outputs from said boundary scan data register and third inputs which receive said outputs from said megacell module, said selection circuitry having outputs, said selection circuitry having selection inputs which control which of said first inputs, said second inputs and said third inputs are routed to said outputs of said selection circuitry;

a JTAG instruction register which stores instruction bits, selected ones of said instruction bits provided to said selection inputs of said selection circuitry to control which of said first inputs, said second inputs and said third inputs of said selection circuitry are routed to said outputs of said selection circuitry, said instruction bits controlled in said normal operational mode to select said first inputs to route the outputs of said custom designed logic circuitry to said output of said selection circuitry, said instruction bits controlled in a JTAG boundary scan test operational mode to select said second inputs to route said outputs from said boundary scan data register to said outputs of said selection circuitry, and said instruction bits controlled in a megacell test mode to select said third inputs to route said outputs of said megacell to said outputs of said selection circuitry;

a plurality of external pins connected to said outputs of said selection circuitry, said outputs from said custom designed logic circuitry being propagated to said external pins when said integrated circuit is operating in said normal operational mode, said test outputs of said megacell module being propagated to said external pins when said selected ones of said instruction register bits are controlled to cause said integrated circuit to operate in said megacell test mode of operation, said outputs from said boundary scan data register being propagated to said external pins when said selected ones of said instruction register bits are controlled to cause said integrated circuit to operate in said JTAG boundary scan test operational mode; and at least one gate interposed between at least one of said input/output pins of said integrated circuit and at least one selected test input of said megacell, said at least one gate controlled by a megacell test signal from said JTAG instruction register to communicate a signal on said at least one of said input/output pins to said at least one selected test input of said megacell when said megacell test signal is active and to force said at least one selected test input of said megacell to a predetermined inactive state when said megacell test signal is not active.

2. A system as defined in claim 1, further comprising a switching circuit including first and second inputs and an output, said switching circuit selecting between an input pin connected with said first input of said switching circuit or said custom designed digital logic circuitry connected with said second input of said switching circuit, said output of said switching circuit being connected to said standardized megacell module.

3. A system as defined in claim 2, wherein said switching circuit comprises a multiplexer.

4. A method of testing a megacell within an integrated circuit having said megacell as an embedded component of circuitry within said integrated circuit, said megacell having at least one test output signal having no connection external to said integrated circuit during normal operation of said integrated circuit, said megacell having at least a first input and a second input, said first input and said second input having no connections external to said integrated circuit during normal operation, said integrated circuit including logic which communicates signals to and receives signals from said megacell during said normal operation of said integrated circuit, said logic applying a signal to said first input of said megacell during normal operation, said integrated circuit having a plurality of signals which are provided as inputs to and outputs from said logic via respective pins of said integrated circuit during said normal operation of said integrated circuit, said method comprising:

applying a serial instruction to said integrated circuit via a JTAG input pin to place said integrated circuit into a predetermined megacell test mode such that said integrated circuit is no longer operating in said normal mode of operation;

selectively disabling at least one of said plurality of output signals from said logic to a respective first external pin of said integrated circuit;

selectively routing said test output signal from said megacell to said respective first external pin of said integrated circuit;

selectively disabling said signal from said logic to said first input to said megacell and applying a test input signal to said first input of said megacell via a second external pin of said integrated circuit to stimulate said megacell to perform a test operation;

selectively routing a signal from a third external pin of said integrated circuit to said second input of said megacell during said test operation and selectively forcing said second input of said megacell to a predetermined fixed logic level during said normal operation; and monitoring said test output signal from said megacell at said respective first pin of said integrated circuit during said test operation.

5. A system for testing a megacell within an integrated circuit having said megacell as an embedded component of circuitry within said integrated circuit, said megacell having at least first and second inputs and at least one output which are not connected to external pins of said integrated circuit during a normal mode of operation of said integrated circuit, said integrated circuit further including logic, said integrated circuit having a plurality of signals which are provided as normal input signals to and normal output signals from said logic on respective external pins of said integrated circuit during said normal operation of said integrated circuit, said integrated circuit further including JTAG boundary scan testing circuitry, said system comprising:

a JTAG input pin, wherein a serial instruction is applied to said JTAG input pin and communicated to said boundary scan testing circuitry, said boundary scan testing circuitry responsive to said serial instruction to place said integrated circuit into one of a predetermined megacell test mode of operation, a boundary scan test mode of operation, or a normal mode of operation;

a first signal pin of said integrated circuit which is interconnected with said logic when said integrated circuit is operating in said normal mode of operation;

a first selectable electrical path from said first pin to said first input of said megacell, wherein a test input signal applied to said first pin when said integrated circuit is in said megacell test mode of operation is communicated to said megacell via said selectable electrical path to thereby stimulate said megacell to perform a test operation and to generate a test output signal, said selectable electrical path blocked when said integrated circuit is operating in said normal mode of operation to force said first input of said megacell to a predetermined fixed logic level;

a second pin of said integrated circuit;

a second selection circuit connected between said second pin of said integrated circuit and said second input of said megacell, said second selection circuit providing a path from said second pin to said second input of said megacell when said integrated circuit is in said megacell test mode of operation, said second selection circuit providing a path from said logic when said integrated circuit is in said normal mode of operation;

a third pin of said integrated circuit; and a selection circuit coupled to said third pin of said integrated circuit which receives said test output signal from said megacell, which receives one of said plurality of output signals from said logic, and which receives a signal from said boundary scan test circuitry, said selection circuit providing a selected output signal to said third pin of said integrated circuit, said selected output signal being said test output signal when said integrated circuit is in said test mode of operation upon application of said serial instruction on said JTAG input pin, said selected output signal being said one of said output signals from said logic when said integrated circuit is in said normal mode of operation, said selected output signal being a boundary scan test signal from said boundary scan test circuitry when said integrated circuit is in said boundary scan test mode of operation.

* * * * *